(12) United States Patent
Ling et al.

(10) Patent No.: US 11,166,385 B2
(45) Date of Patent: Nov. 2, 2021

(54) COMPONENT CARRIER HAVING A LASER VIA AND METHOD OF MANUFACTURING

(71) Applicant: AT&S (China) Co. Ltd., Shanghai (CN)

(72) Inventors: Yee-Bing Ling, Kuching (MY); Kenny Cao, KunShan (CN); Jackson Xu, Shanghai (CN)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 16/515,434

(22) Filed: Jul. 18, 2019

(65) Prior Publication Data

US 2020/0137892 A1 Apr. 30, 2020

(30) Foreign Application Priority Data

Oct. 26, 2018 (CN) .......................... 201821752328.9

(51) Int. Cl.
*H05K 3/40* (2006.01)
*H05K 1/11* (2006.01)
*H05K 3/00* (2006.01)
*H01L 23/498* (2006.01)
*H01L 21/48* (2006.01)

(52) U.S. Cl.
CPC ........... *H05K 3/4038* (2013.01); *H05K 1/115* (2013.01); *H05K 3/0026* (2013.01); *H01L 21/486* (2013.01); *H01L 23/49827* (2013.01); *H05K 2201/09509* (2013.01); *H05K 2203/072* (2013.01); *H05K 2203/0723* (2013.01); *H05K 2203/107* (2013.01)

(58) Field of Classification Search
CPC .... H05K 3/4038; H05K 1/115; H05K 3/0026; H05K 2201/09509; H01L 21/486; H01L 23/49827
USPC .......................................................... 174/262
See application file for complete search history.

(56) References Cited

U.S. PATENT DOCUMENTS

| 2006/0202348 A1 | 9/2006 | Kameyama et al. |
| 2012/0220082 A1* | 8/2012 | Ng .......................... H01L 21/568 438/124 |
| 2014/0116762 A1* | 5/2014 | Oyoshi .................. H05K 1/113 174/258 |

* cited by examiner

*Primary Examiner* — Tremesha S Willis
(74) *Attorney, Agent, or Firm* — Robert A. Blaha; Smith Tempel Blaha LLC

(57) ABSTRACT

A component carrier is disclosed. The component carrier includes: i) at least one electrically insulating layer structure and at least one electrically conductive layer structure, wherein the electrically conductive layer structure is formed in or below the electrically insulating layer structure, and ii) a laser via formed in the electrically insulating layer structure and extending down to the electrically conductive layer structure, wherein the laser via is at least partially filled with an electrically conductive material. Hereby, a connection diameter at a first end of the laser via at the electrically conductive layer structure is equal to or larger than an opening diameter at a second end of the laser via facing away from the electrically conductive layer structure.

17 Claims, 3 Drawing Sheets

COMPONENT CARRIER HAVING A LASER VIA AND METHOD OF MANUFACTURING

TECHNICAL FIELD

The invention relates to a component carrier having a laser via and a method of manufacturing a component carrier.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

As the design of components carrier is getting denser and more lines and vias have to be placed into smaller spaces, the line width and via diameters also have to become smaller as well. Smaller line width and spacing may for example be achieved by technologies such as mSAP or SAP, however, providing a reliable via, i.e. a vertical interconnection access, with a small size (with respect to diameter), e.g. a micro-via, is still a challenge.

FIG. 2 shows an example from the prior art. A printed circuit board 200 comprises an electrically insulating layer 202 and an electrically conductive layer 204 below the electrically insulating layer 202. A blind hole 210 is formed in said electrically insulating layer 202 extending down to the electrically conductive layer 204. Hereby, a first end 220 of the blind hole 210 at the electrically conductive layer 204 has a first diameter FD which is smaller than a second diameter SD at a second end 230 of the blind hole 210 facing away from the electrically conductive layer 204. Especially when it comes to smaller blind holes, e.g. blind micro-vias, the reliability of the prior art blind hole, with respect to e.g. signal integrity, becomes worse.

SUMMARY

There may be a need to provide a component carrier having a via with a very small size (with respect to the via diameter) which still functions in a reliable manner.

A component carrier and a method of manufacturing a component carrier according to the independent claims are provided.

According to an exemplary embodiment, a component carrier is provided, wherein the component carrier comprises: i) at least one electrically insulating layer structure and at least one electrically conductive layer structure, wherein the electrically conductive layer structure is formed in or below the electrically insulating layer structure, and ii) a laser via formed in the electrically insulating layer structure and extending down to the electrically conductive layer structure, wherein the laser via is at least partially filled with an electrically conductive material. Hereby, a connection diameter at a first end of the laser via at the electrically conductive layer structure is equal to or larger than an opening diameter at a second end of the laser via facing away from the electrically conductive layer structure.

According to a further exemplary embodiment, a method of manufacturing a component carrier is provided. The method comprises: i) forming a stack of at least one electrically insulating layer structure and at least one electrically conductive layer structure, wherein the electrically conductive layer structure is formed in or below the electrically insulating layer structure, ii) forming a laser via, in particular by using laser drilling, in the electrically insulating layer structure such that the laser via extends down to the electrically conductive layer structure, and such that a connection diameter at a first end of the laser via at the electrically conductive layer structure is equal to or larger than an opening diameter at a second end of the laser via facing away from the electrically conductive layer structure. The method may be applied to manufacture the described component carrier and may thus provide the same advantages.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board (PCB), an organic interposer, a substrate-like-PCB (SLP), and an IC (integrated circuit) substrate. A component carrier may also be a hybrid board combining different ones of the above-mentioned types of component carriers.

In the context of the present application, the term "via" may particularly denote a vertical interconnection access being an electrical connection between layers in a component carrier (e.g. a printed circuit board) that goes through the plane of one or more adjacent layers. The term via may include through-hole vias, buried vias, and blind vias. A blind via may be a via that is not completely drilled through an electrically insulating layer, but is merely formed into the electrically insulating layer. For example, the blind via may extend down to an electrically conductive layer which is embedded in the electrically insulating layer. In another context, the term blind via may refer to a via in a component carrier which comprises a plurality of layers, wherein the blind via extends through one or several, but not all, of the plurality of layers of the component carrier. For example, a via may connect an electrically conductive layer on top of an electrically insulating layer, through said electrically insulating layer, to another electrically conductive layer below the electrically insulating layer. The term "micro via" may refer to an interconnect between layers in high density interconnect (HDI) substrates and printed circuit boards (PCBs) to accommodate the high I/O density of advanced packages. For example, a diameter of a micro via may be below 100 μm, in particular below 70 μm.

In the context of the present application, the term "laser via" may refer to a via, as described above, wherein the via has been formed by a laser method, for example laser drilling and/or laser ablation. It may be inherent to a laser beam that it forms the hole, i.e. the laser via, not with straight sidewalls, as in the case of mechanical drilling, but in the shape of a cone. In other words, the laser via, in comparison to a mechanically drilled hole, tapers from one end of the via to the other end of the via, i.e. decreases in diameter. In this manner, the diameter at a first end of the laser via may be different from another diameter at the other second end, being opposite to the first end, of the laser via. There are a variety of laser types and application techniques available for drilling a hole in a component carrier. For example, a $CO_2$ laser, Excimer laser, Nd-YAG laser, or UV laser.

According to an exemplary embodiment, the invention is based on the idea that a reliable via, in particular a reliable laser via, with a small diameter (with respect to the diameter) can be provided, when the via, being in an electrically insulating layer structure of a component carrier, is manufactured such that a connection diameter at a first end of the via (which is at the bottom of the via, at an intersection point with an electrically conductive layer structure being in or below the electrically insulating layer structure) is equal or larger than an opening diameter at a second end of the via (at the top of the via, facing away from the electrically conductive layer structure, eventually being flush with the main surface of the electrically insulating layer structure). While conventionally (see the prior art example in FIG. 2 above) a laser via is manufactured such that a first end of the blind hole at the electrically conductive layer has a first diameter which is smaller than a second diameter at a second end of the blind hole, facing away from the electrically conductive layer, it has now been surprisingly found that manufacturing the laser via exactly the other way around, i.e. the connection diameter at the first end (bottom) of the via being equal or larger than the opening diameter at a second end (top) of the via, strongly improves the reliability of the via and, as a consequence, the overall performance of the component carrier. In other words, the via bottom diameter is equal or larger than the via top diameter and thereby, the reliability of a small via is improved. While beforehand, laser vias were provided with a tapering from the top of the via to the bottom, surprising advantageous (as described in the following) have been found for a completely different architecture, wherein a tapering is from the bottom of the via to the top.

The special via structure described above may be filled with an electrically conductive material (e.g. electroplated with copper) which provides several advantages. Issues with respect to via crack formation or via separation may be overcome. The via structure may in this manner be further reinforced because the stress energy is transferred to a layer/section, where options are available to reinforce the structure to overcome stress energy.

Stress energy may especially occur at the via section with the smallest diameter, conventionally the connection diameter section at the bottom. As this diameter is very small, it is difficult to further reinforce this section of the via, being buried in the component carrier. However, with the opening connection section at the top of the via having an equal or smaller diameter, stress energy will concentrate at this location. The opening diameter section of the via may be more easily and efficiently be reinforced than the connection diameter section. For example, after applying a seed layer using electro-less plating, a thick layer of electrically conductive material (e.g. copper) may be deposited, e.g. by flash plating, over the seed layer and around the edge portions (i.e. corners of the via opening) between a main surface of the electrically insulating material and the top section of the via (opening diameter section). Wrapping a thick electrically conductive material around the edge portions may strongly reinforce the via structure against the concentrated stress energy. Such a wrapping is not possible in conventional blind holes, wherein the location of strongest stress energy at the smallest diameter is at the bottom of the hole. In some prior art examples, the bottom of the blind hole is only covered by a thin seed layer. In other words, the weakest point is shifted to a different location, which enables efficient reinforcement and thereby improves the via reliability. Together with the via reliability, the performance of the whole component carrier may be improved.

The described component carrier may be realized with existing and established equipment (e.g. laser drill machine and copper plating) such that it may be directly implemented into production lines. In this manner, a smaller via size is enabled without sacrificing reliability in the component carrier. This may make the described component carrier especially interesting for future applications such as wearable products or internet of things which generally have very small via width and tight line spacing.

In the following, further exemplary embodiments of the method and the component carrier will be explained.

According to an exemplary embodiment, the laser via tapers from the first end towards the second end. Thereby, the advantageous effects discussed above may be especially pronounced.

By providing the laser via with a structure, which could be described as tapering (in other words decreasing), the diameter of the via becomes smaller from bottom to top in a regular manner. Thus, there is no abrupt transition with respect to the surface of the sidewalls of the via. Instead, the surfaces of the sidewalls may be formed in a straight manner without transition sections. In other words, the sidewalls are slanted in a regular manner. The via may be formed at least partially like a cone or a truncated cone, wherein the bottom surface of the cone is at the bottom of the via and the tip of the cone or the top surface of the cone, respectively, is at the top of the via.

According to a further exemplary embodiment, the opening diameter is 70 μm or smaller, in particular 60 μm or smaller. This may provide the advantage that a via with a very small size can be manufactured which still functions in a reliable manner.

The via may be a micro-via, i.e. a via with a very small diameter. With respect to the diameter, an average diameter, a diameter in the middle of the via, or a diameter at the top/bottom of the via may be used as reference. For example, the diameter may be smaller than 100 μm. In other examples, the diameter may be 80 μm or smaller, 70 μm or smaller, 60 μm or smaller, or even 50 μm or smaller.

According to a further exemplary embodiment, the component carrier further comprises an edge portion between a main surface of the electrically insulating layer structure and the laser via, wherein the second end of the laser via is located at the edge portion. This may provide the advantage that said edge portion, where stress energy may concentrate, can be reinforced in a straightforward and efficient manner.

The laser via may be drilled into the electrically insulating layer structure, hence there will be an edge between the opening of the hole and the main surface (from which the drilling of the hole has been started) of the electrically insulating layer structure. Optionally, there may be a further electrically conductive layer structure arranged on the electrically insulating layer structure. In this case, the edge portion may be defined as the region between the main surface of the further electrically conductive layer structure and the laser via. The edge portion thereby also covers an exposed edge (a sidewall surface) of the electrically insulating layer structure.

According to a further exemplary embodiment, the laser via comprises an electrically conductive film being a seed layer on the laser via sidewall surface, in particular on the sidewall surface of the electrically insulating layer structure.

This may provide the advantage that a basis for further electroplating steps is formed with existing and established methods.

Because the laser via has been drilled into the electrically insulating layer structure, the sidewalls of the electrically insulating layer structure form the sidewalls of the via hole. By providing a seed layer of electrically conductive material, subsequent electroplating steps may be performed which cannot be applied directly onto the surface of the electrically insulating layer structure.

The term "seed layer" may refer to a thin layer (e.g. around 0.5 µm) of metal (e.g. copper) that is plated on a surface or in cavities (e.g. an electrically insulating layer structure) by a chemical reaction to obtain a conductive surface (e.g. using electro-less plating). A further, much thicker metal layer (e.g. around 25 µm) may then be electroplated on the seed layer by applying current onto the component carrier.

According to a further exemplary embodiment, the seed layer covers the edge portion, in particular the seed layer at least partially covers the main surface of the electrically insulating layer structure. This may provide the advantage that a basis for further electroplating steps is formed with existing and established methods, such that the edge portion can be efficiently reinforced.

The seed layer may cover the sidewalls of the electrically insulating layer structure in the via hole, the edge portion, and at least a part of the main surface of the electrically insulating layer structure. In case that there is an optional further electrically conductive layer structure arranged on the electrically insulating layer structure, then the further electrically conductive layer structure may be at least partially covered with the seed layer. In another embodiment, the further electrically conductive layer structure itself may function as a seed layer.

According to a further exemplary embodiment, the electrically conductive material, which at least partially fills the laser via, is formed as a layer that wraps around the edge portion. This may provide the advantage that the via can be filled and/or the edge portion can be reinforced in an efficient manner using established procedures.

For example, a step of electroplating, in particular flash-plating, may be applied to deposit a thick layer of the electrically conductive material, e.g. copper. For example, copper material, which has been formed above the seed layer, in particular by flash-plating, may comprise a thickness in the range between 0.3 µm and 15 µm, in particular in the range between 4 µm and 10 µm, more in particular in a range between 6 and 9 µm, preferably 7 to 8 µm.

This thick layer of electrically conductive material may cover the seed layer in the via hole, the edge portion, and/or the electrically insulating layer structure. In the case that a further electrically conductive layer structure is arranged on the electrically insulating layer structure, then the further electrically conductive layer structure may at least partially be covered by the electrically conductive material. Said electrically conductive material, in particular in form of a (copper) layer, may thereby especially reinforce the edge portion. In other words, a thick layer of electrically conductive material (e.g. deposited by flash-plating) is wrapped around the edge portion and thereby efficiently reinforces this section, which may be prone to high stress energy.

According to a further exemplary embodiment, the electrically conductive material completely fills the laser via and covers the edge portion. With this measure, a very robust and reliable via may be provided.

The laser via may be completely filled with the electrically conductive material, e.g. copper, such that a very robust via structure is obtained. In the final component carrier, the laser via is thus completely filled and the edge portion is hence also completely covered with the electrically conductive material and thus very stable against stress energy. As has already been described above, in this manner, a thick layer of electrically conductive material may also cover the main surface of the electrically insulating layer structure and/or of an optional further electrically conductive layer structure. Thereby, a very robust laser via with improved reliability may be provided.

According to a further exemplary embodiment, the component carrier further comprising an electrically conductive material layer arranged above the electrically insulating layer structure such that the electrically conductive material layer covers and electrically contacts the second end of the laser via. Taking this measure, a robust and reliable laser via structure may be provided, which is integrated in the electrical connections of the component carrier in an efficient manner.

The electrically conductive material layer may be formed, e.g. by electroplating, in the same step as the via filling. After the via has been (completely) filled, further electrically conductive material may be deposited onto the filled laser via and above the main surface of the electrically insulating layer structure (eventually also above a further electrically conductive layer structure and/or a layer of electrically conductive material, which may have been formed by flash plating). In this manner, the laser via may electrically connect the electrically conductive material layer through the electrically insulating layer structure with the electrically conductive layer structure.

According to a further exemplary embodiment, laser drilling further comprises: i) adjusting first parameters, in particular energy parameters, for a first laser shot, ii) performing a first laser shot, iii) adjusting second parameters, in particular energy parameters, for a second shot being different from the first parameters, and iv) performing a second laser shot. This may provide the advantage that an efficient and reliable via structure can be manufactured in a fast and easily controllable manner.

The described laser via structure, wherein the connection diameter is equal or larger than the opening diameter, may be manufactured based on adjusting the parameters of the laser that is used during laser drilling. While it is inherent to a conventional laser via that it is formed with a connection diameter being smaller than the opening diameter, it has been surprisingly found that the parameters of the laser shots can be controlled such that the described laser via structure according to an embodiment of the invention can be obtained. For example, the energy of the laser shots may be adjusted. In this manner, a first shot (a first step of laser drilling) may be performed and the result may be investigated. Depending on the investigation, the energy may be adjusted and a second shot (a second step of laser drilling) may be applied in order to obtain the described laser via structure. Hereby, adjusting could be done in a straightforward manner or dynamically using a feed-back loop. Besides the energy (power) of the laser, other parameters that may be adjusted may include the frequency of laser shots, the wave length, speed, resolution, and the type of laser.

In this via shape formation, wavelength and laser beam width may be the two critical parameters, apart from the laser energy. Wavelength and laser beam width allow to transfer more energy to the bottom of the via, which may be the critical energy to burn out (remove) more resin to form a larger diameter.

According to a further exemplary embodiment, the method further comprises at least partially filling the laser via with an electrically conductive material, in particular by flash-plating. This may provide the advantage that the laser via can be efficiently reinforced, in particular at the edge portions, where stress energy may concentrate.

The term "plating" may denote a process of plating, i.e. covering of a conductive surface, in which process a metal is deposited onto the conductive surface. The term "plating" may refer to electroplating. Further, the term "plating" may refer to galvanizing. Furthermore, the term "plating" may refer to electroplating a surface of a preform of a component carrier with an electrically conductive material.

The term "electroplating", also termed galvanizing, refers to a process of deposition of metallic ions onto a surface, which should be plated. Electroplating may take place in a bath and may comprise the use of an anode and a cathode. The anode (positively charged) may be placed into a bath in order to establish an electric field between the anode and a negatively charged entity, which should be electroplated, and which serves as a cathode. The electric field drives cations, such as copper ions, which are dissolved in the bath, to the surface of the entity, which should be electro-plated. At the negatively charged surface, the cations will be chemically reduced and a layer of e.g. copper will start growing on the surface of the entity, which should be electroplated. This process may be used for forming a layer or filling a cavity.

The term "flash-plating" may refer to a very fast and highly efficient electroplating process. For example, the concentration of the electrolyte, e.g. copper, may be suddenly increased to very high concentrations in order to provide a very fast electroplating process. A hole in a component carrier such as a laser via may be filled partially by flash-plating and then the rest of the hole may be filled by applying known via fill techniques (e.g. normal electroplating). However, a laser via may as well be completely filled by flash-plating.

According to a further exemplary embodiment, the method further comprises forming a seed layer in the laser via, in particular by electro-less plating. This may provide the advantage that a mandatory step for efficient electroplating can be performed using known and established technologies.

"Electro-less plating", also termed chemical or autocatalytic plating, may be a non-galvanic method that may involve several simultaneous reactions in a bath. For example, in a first place an electro-less plating step is performed in order to produce a conductive layer upon an electrically insulating layer of a component carrier. This electrically conductive layer may be necessary for performing a subsequent electroplating step. This is because during an electro-plating process in a bath, the entity, which should be electroplated, is used as a cathode (negatively charged). The negative charge can be set e.g. by means of a power supply, which contacts the surface of the entity, which should be electroplated, e.g. with contact rings. However, this can only be done, if the surface of the entity is made of electrically conductive material. Therefore, electro-less plating may be mandatory in order to produce a thin electrically conductive material layer onto an electrically insulating material in a first step.

According to a further exemplary embodiment, the method further comprises filling, in particular completely filling, the laser via with the electrically conductive material, based on the seed layer, with electroplating. This may provide the advantage that the via can be manufactured and reinforced in a straightforward manner which is easily implementable into existing production lines.

According to a further embodiment, the filled laser via of the component carrier may be failure-free, in particular crack-free and void-free. This may provide the advantage that a high-quality component carrier may be provided with an efficient functionality e.g. in the technical field of signal transduction. Furthermore, the high-quality component carrier may have been manufactured in a cost-efficient and environmentally friendly manner, because no supplementary chemical additives are needed.

According to an exemplary embodiment, an electronic component may be arranged at or embedded in the component carrier. The electronic component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), a die, an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, a logic chip, a light guide, and an energy harvesting unit. However, other components may be embedded in or surface mounted on the component carrier. For example, a magnetic element can be used as a component. Such a magnetic element may be a permanent magnetic element (such as a ferromagnetic element, an antiferromagnetic element or a ferromagnetic element, for instance a ferrite coupling structure) or may be a paramagnetic element. However, the component may also be a substrate, an interposer or a further component carrier, for example in a board-in-board configuration. Moreover, also other components, in particular those which generate and emit electromagnetic radiation and/or are sensitive with regard to electromagnetic radiation propagating from an environment, may be used as component.

In an embodiment, the at least one electrically insulating (layer) structure comprises at least one of the group consisting of resin (such as reinforced or non-reinforced resins, for instance epoxy resin or Bismaleimide-Triazine resin, cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon), a ceramic, and a metal oxide. Teflon is a registered trademark of the Chemours Company FC, LLC of Delaware, U.S.A. Reinforcing materials such as webs, fibers or spheres, for example made of glass (multilayer glass) may be used as well. Although prepreg particularly FR4 are usually preferred for rigid PCBs, other materials in particular epoxy-based Build-Up Film for substrates for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres). Furthermore, the component carrier may be configured as a substrate-like-printed circuit board (SLP).

The substrate or interposer may consist of at least a layer of glass, Silicon (Si) or a photo imageable or dry-etchable organic material like epoxy-based Build-Up films or polymer compounds like Polyimide, Polybenzoxazole, or Benzocyclobutene.

In an embodiment, the at least one electrically conductive layer structure and/or the electrically conductive material comprises at least one of the group consisting of copper, aluminum, nickel, silver, gold, palladium, cobalt, and tungsten. Although copper is usually preferred, other materials or coated versions thereof are possible as well.

DETAILED DESCRIPTION OF ILLUSTRATED EMBODIMENTS

Figure 1A:
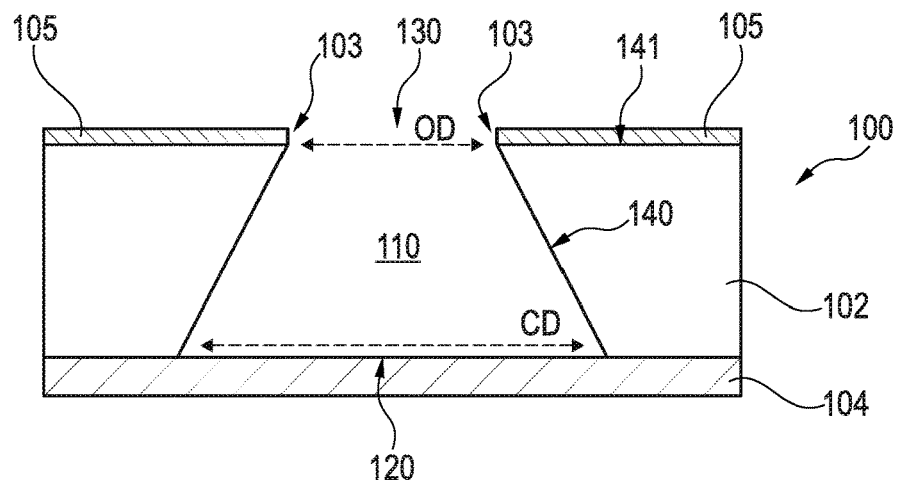
FIGS. 1A to 1D illustrate exemplary embodiments of a method of manufacturing a component carrier according to embodiments of the invention.

The aspects defined above and further aspects of the invention are apparent from the examples of embodiment to be described hereinafter and are explained with reference to these examples of embodiment.

The illustrations in the drawings are schematic. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, after laser drilling a blind micro-via, the via is processed by electro-less copper plating. Then, flash plating is used to add a layer of copper, including an opening corner of the via, thereby reinforcing the structure. Finally, the remaining empty space of the via is filled up.

According to an exemplary embodiment of the invention, the opening diameter is smaller than the connection diameter and all the stress energy will be concentrated on the opening diameter section rather than at the connection diameter section, since the opening diameter now has a smaller cross area compared to the connection diameter. Unlike the connection diameter section, the opening diameter section receives the flash copper plating layer to wrap around the corners (edge portions) such that the flash copper plating layer acts as the reinforced copper structure against applied stress energy. Thereby, the reliability of the via can be improved since the (flash) plated copper layer is more compact and stronger compared to an electro-less plated copper layer.

FIGS. 1A to 1D illustrate exemplary embodiments of methods for manufacturing a component carrier 100.

FIG. 1A: A component carrier 100 is provided, wherein the component carrier 100 comprises at least one electrically insulating layer structure 102 and at least one electrically conductive layer structure 104, wherein the electrically conductive layer structure 104 is formed below (alternatively embedded in) the electrically insulating layer structure 102. A further electrically conductive layer structure 105 is optionally arranged on the electrically insulating layer structure 102. For example, the component carrier 100 is provided as a copper-clad laminate (CCL), wherein an electrically insulating core 102 is sandwiched between two electrically conductive layer structures 104, 105.

A laser via 110 has been formed into the electrically insulating layer structure 102 by laser drilling such that the sidewalls 140 of the electrically insulating layer structure 102 form the sidewalls of the laser via 110. The laser via 110 extends down to the electrically conductive layer structure 104 below the electrically insulating layer structure 102. The laser via 110 comprises a first end 120 at the bottom of the via 110 at an intersection region with the electrically conductive layer structure 104. At this first end 120 there is a connection diameter CD section, where the connection diameter CD is measured. Furthermore, the laser via 110 comprises a second end 130 at the top of the via 110 at a further intersection region with a main surface 141 of the electrically insulating layer structure 102. Alternatively, the second end 130 may be defined at an intersection region with the further electrically conductive layer structure 105. The second end 130 of the via is facing away from the electrically conductive layer structure 104. At this second end 130 there is an opening diameter OD section, where the opening diameter OD is measured. There is an edge portion 103 between the main surface 141 of the electrically insulating layer structure 102 and the laser via 110 (eventually extending over the sidewall 141 surface of the electrically insulating layer structure 102 and the main surface of the further electrically conductive layer structure 105), wherein the second end 130 of the laser via 110 is located at the edge portion 103. Hereby, the connection diameter CD is larger than the opening diameter OD such that the structure of the laser via 110 tapers from the first end 120, i.e. the CD section, towards the second end 130, i.e. the OD section. The laser via 110 is a micro via and the opening diameter OD is around 70 μm (or smaller). When taken into account the whole component carrier (not shown), the via is a blind via.

Figure 1B:
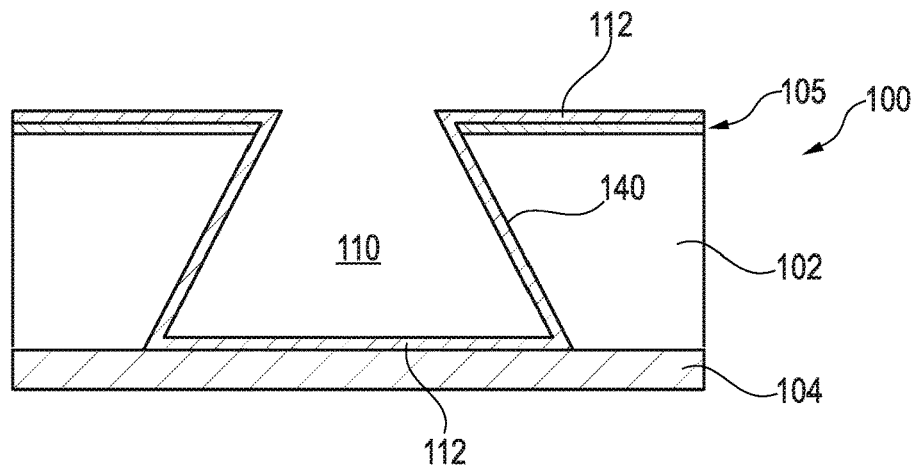

FIG. 1B: An electrically conductive film being a seed layer 112 of copper, approximately 0.5 μm thick, is formed using an electro-less plating process on the laser via sidewall surface 140 which is the sidewall surface 140 of the electrically insulating layer structure 102. The seed layer 112 covers the bottom of the via 110, the sidewalls 141 of the via, the edge portion 103, and the further electrically conductive layer structure 105 arranged on the electrically insulating layer structure 102.

Figure 1C:
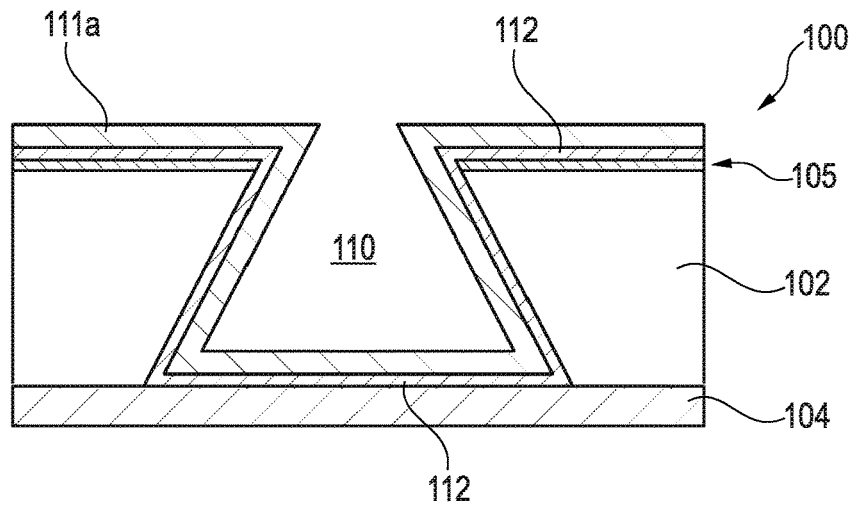

FIG. 1C: A step of flash-plating is applied in order to deposit a thick layer of electrically conductive material 111a, e.g. copper, on the seed layer 112. Hereby, the seed layer 112 is mandatory for the electroplating process. The electrically conductive material 111a at least partially fills the laser via 110 and is for example around 25 μm thick. Especially at the edge region 103, the layer of electrically conductive material 111a acts as a reinforcement layer by being wrapped around said edge portion 103. Thereby, stress energy that concentrates at the opening diameter OD section with the smaller diameter is efficiently compensated.

Figure 1D:
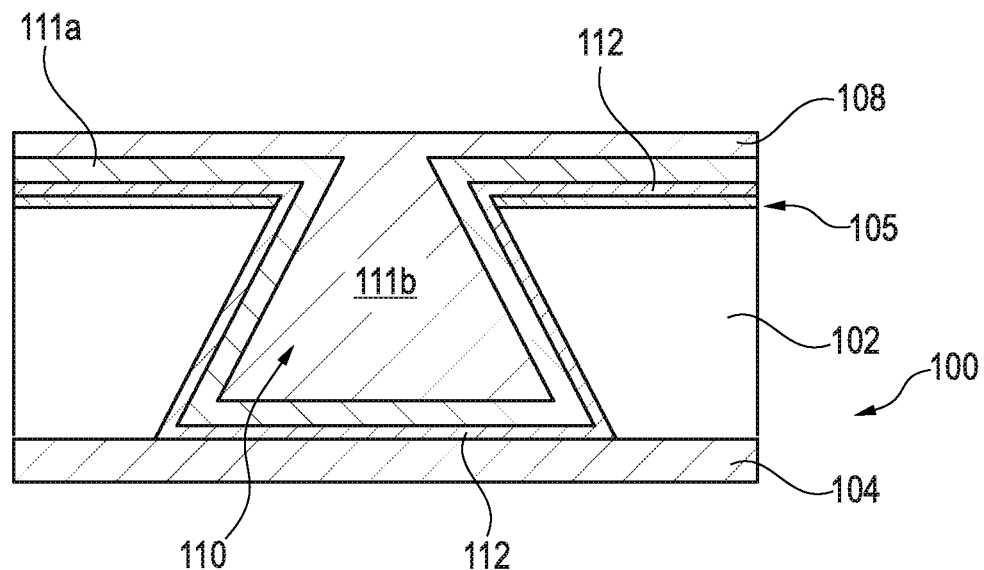
Figure 2:
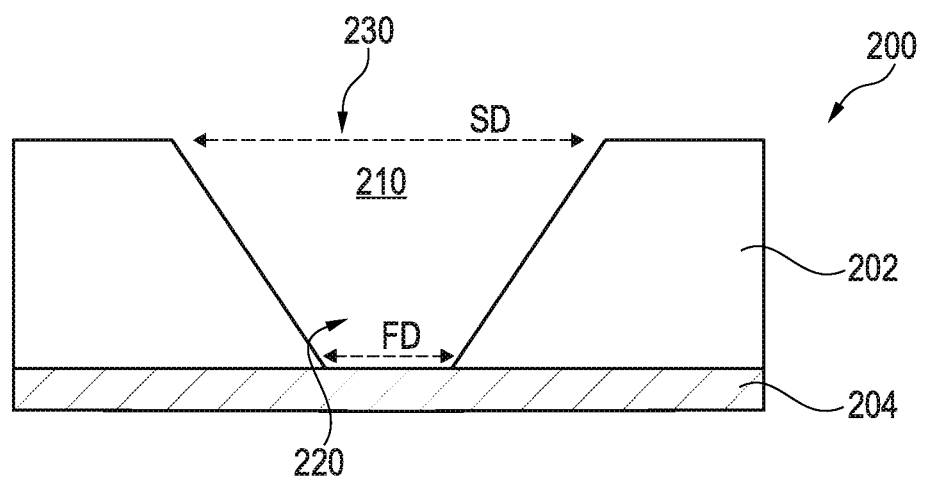
FIG. 2 shows a blind hole from the prior art (see discussion above).

FIG. 1D: A step of via filling, e.g. electroplating with copper, is applied in order to completely fill the laser via 110 with electrically conductive material 111b. Thereby, also the edge portion 103 is fully covered with the electrically conductive material 111b. Furthermore, an electrically conductive material layer 108 is arranged on the electrically insulating layer structure 102, in particular on the flash-plated layer of electrically conductive material 111a such that the electrically conductive material layer 108 covers and electrically contacts the second end 130 of the laser via 110. Preferably, the electrically conductive material layer 108 is formed in the step of filling the via using electroplating.

Figure 3A:
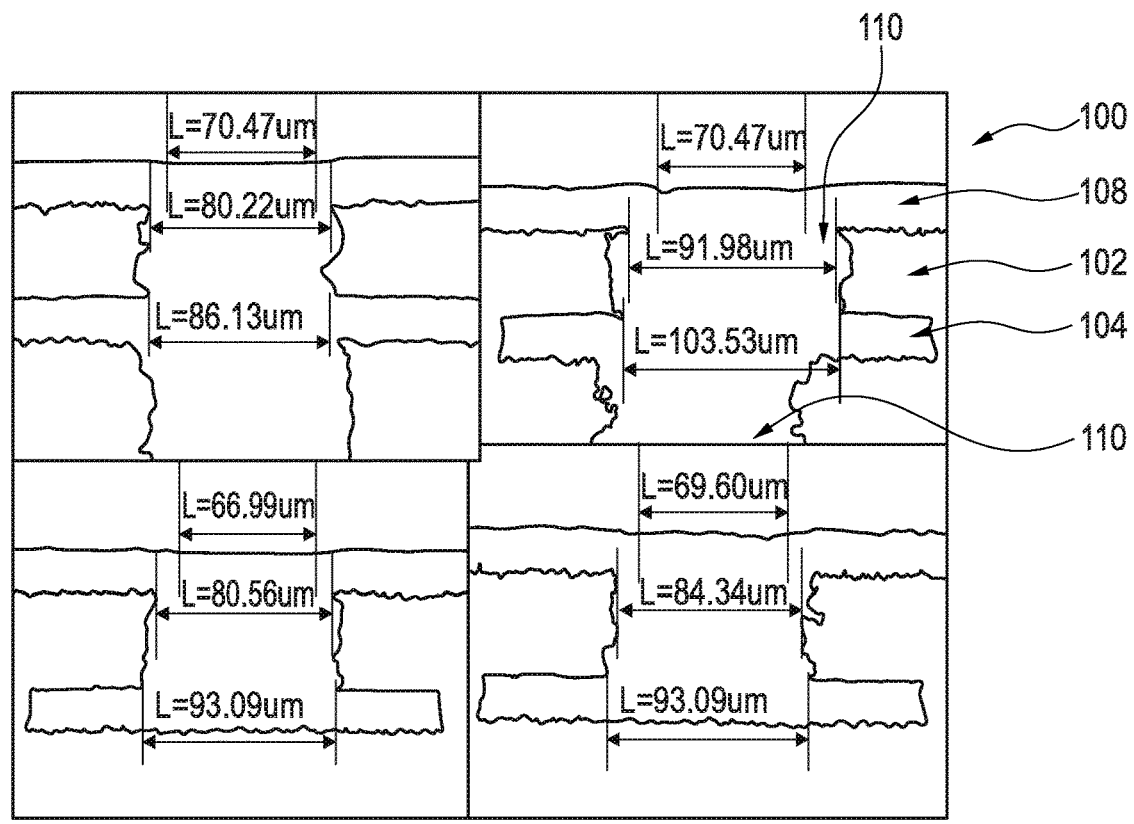
FIGS. 3A and 3B illustrate pictures of exemplary laser vias in a component carrier which have been manufactured according to exemplary embodiments of the invention.
Figure 3B:
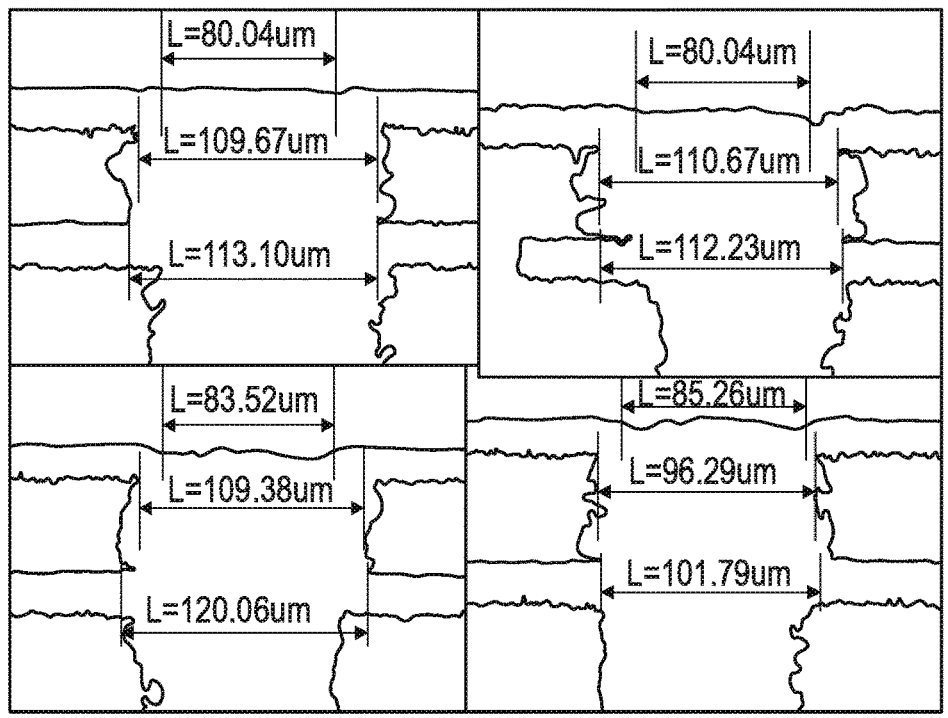

FIGS. 3A and 3B show pictures of laser vias 110 in a component carrier 100 which have been manufactured according to the described method. In these embodiments, the laser via 110 connects an electrically conductive material layer 108, on an electrically insulating layer structure 102, with an electrically conductive layer structure 104, in or below the electrically insulating layer structure 102, through said electrically insulating layer structure 102. Hereby, it can be seen that the connection diameter CD is equal or larger than the opening diameter OD.

FIG. 3A shows embodiments, wherein the opening diameter OD of the laser via is around 65 μm.

FIG. 3B shows embodiments, wherein the opening diameter OD of the laser via is around 80 μm.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

REFERENCE SIGNS

100 Component carrier
102 Electrically insulating layer structure
103 Edge portion
104 Electrically conductive layer structure
105 Further electrically conductive layer structure
108 Electrically conductive material layer
110 Laser via
111a, 111b Electrically conductive material
112 Seed layer, electrically conductive film
120 First end of laser via
130 Second end of laser via
140 Sidewall of electrically insulating layer structure
141 Main surface of electrically insulating layer structure
OD Opening diameter
CD Connection diameter

The invention claimed is:
1. A component carrier configured as one of the group consisting of a printed circuit board, an organic interposer, a substrate-like-PCB, and an IC substrate, the component carrier comprising:
at least one electrically insulating layer structure and at least one electrically conductive layer structure, wherein the electrically conductive layer structure is formed in or below the electrically insulating layer structure; and
a laser via formed in the electrically insulating layer structure and extending down to the electrically conductive layer structure, wherein the laser via is at least partially filled with an electrically conductive material;
wherein a connection diameter at a first end of the laser via at the electrically conductive layer structure is larger than an opening diameter at a second end of the laser via facing away from the electrically conductive layer structure, such that the laser via tapers in a direction opposite to the drilling direction, wherein the opening diameter at the second end is formed by laser drilling before the connection diameter at the first end is formed by laser drilling, so that the laser via does not taper in the drilling direction.

2. The component carrier according to claim 1, wherein the opening diameter is 70 μm or smaller.

3. The component carrier according to claim 1, further comprising:

an edge portion between a main surface of the electrically insulating layer structure and the laser via, wherein the second end of the laser via is located at the edge portion.

4. The component carrier according to claim 3, wherein at least a part of the electrically conductive material is arranged as a layer that is wrapped around the edge portion.

5. The component carrier according to claim 3, wherein the electrically conductive material completely fills the laser via and covers the edge portion.

6. The component carrier according to claim 1, wherein the laser via comprises an electrically conductive film being a seed layer on the laser via sidewall surface.

7. The component carrier according to claim 6, wherein the laser via sidewall surface is on the sidewall surface of the electrically insulating layer structure.

8. The component carrier according to claim 6, wherein the seed layer covers the edge portion.

9. The component carrier according to claim 6, wherein the seed layer at least partially covers the main surface of the electrically insulating layer structure.

10. The component carrier according to claim 1, further comprising:

an electrically conductive material layer arranged on the electrically insulating layer structure such that the electrically conductive material layer covers and electrically contacts the second end of the laser via.

11. The component carrier according to claim 1, wherein the at least one electrically conductive layer structure and/or the electrically conductive material comprises at least one of the group consisting of copper, aluminum, nickel, silver, gold, palladium, cobalt, and tungsten.

12. The component carrier according to claim 1, wherein the at least one electrically insulating layer structure comprises at least one of the group consisting of resin, epoxy resin or Bismaleimide-Triazine resin, cyanate ester, polyphenylene derivate, glass, glass fibers, multi-layer glass, glass-like materials, prepreg material, FR-4 or FR-5, polyimide, polyamide, liquid crystal polymer, epoxy-based Build-Up Film, polytetrafluoroethylene, a ceramic, and a metal oxide.

13. A method of manufacturing a component carrier configured as one of the group consisting of a printed circuit board, an organic interposer, a substrate-like-PCB, and an IC substrate, the method comprising:

forming a stack of at least one electrically insulating layer structure and at least one electrically conductive layer structure, wherein the electrically conductive layer structure is formed in or below the electrically insulating layer structure; and forming a laser via in the electrically insulating layer structure such that the laser via extends down to the electrically conductive layer structure, and such that a connection diameter at a first end of the laser via at the electrically conductive layer structure is larger than an opening diameter at a second end of the laser via facing away from the electrically conductive layer structure, such that the laser via tapers in a direction opposite to the drilling direction;

wherein forming the laser via further comprises:

forming the opening diameter at the second end by laser drilling, and afterwards forming the connection diameter at the first end by laser drilling, so that the laser via does not taper in the laser drilling direction.

14. The method according to claim 13, further comprising:

adjusting first parameters for a first laser shot;

performing a first laser shot;

adjusting second parameters for a second shot the second parameters being different from the first parameters; and performing a second laser shot.

15. The method according to claim 13, further comprising:

at least partially filling the laser via with an electrically conductive material.

16. The method according to claim 13, further comprising:

forming a seed layer in the laser via.

17. The method according to claim 16, further comprising:

filling the laser via with the electrically conductive material, based on the seed layer, with electroplating.

* * * * *